(12) United States Patent
Yang

(10) Patent No.: US 6,620,648 B2
(45) Date of Patent: Sep. 16, 2003

(54) MULTI-CHIP MODULE WITH EXTENSION

(75) Inventor: Jicheng Yang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 09/941,315

(22) Filed: Aug. 29, 2001

(65) Prior Publication Data

US 2002/0024151 A1 Feb. 28, 2002

Related U.S. Application Data

(62) Division of application No. 09/420,817, filed on Oct. 19, 1999.

(51) Int. Cl.[7] ............................................. H01L 21/44
(52) U.S. Cl. ................................ 438/107; 438/613
(58) Field of Search ............................ 257/684, 685, 257/686, 687, 688, 700, 701, 737, 727, 738, 778, 673, 677; 438/107, 109, 110, 613, 123

(56) References Cited

U.S. PATENT DOCUMENTS 5,239,198 A * 8/1993 Lin et al. ................ 257/693
5,696,031 A   12/1997 Wark
5,917,242 A * 6/1999 Ball ....................... 257/737

* cited by examiner

*Primary Examiner*—Roy Potter
(74) *Attorney, Agent, or Firm*—Trop, Pruner & Hu, P.C.

(57) ABSTRACT

A multi-chip module may include a pair of chips which are arranged one over the other on each side of a laminate layer. A central passage through the laminate layer provides a passage to wire bond a chip on a first side of the laminate layer to contacts on a second side of the laminate layer. A second chip is also placed on the second side of the laminate layer. By causing the laminate layer to extend outwardly beyond the first and second chips, and providing contacts on the extension, contact may be made to the laminate layer extension for electrically coupling the first and second chips to the outside world.

15 Claims, 3 Drawing Sheets

MULTI-CHIP MODULE WITH EXTENSION

This is a divisional of prior application Ser. No. 09/420,817 filed Oct. 19, 1999.

BACKGROUND

This invention relates generally to multi-chip modules for coupling more than one chip together in a single package.

For a number of reasons, it is desirable to package more than one integrated circuit die or chip in a single package. In some cases, the two dice may necessitate different processing technologies. In such case, the two dice must be made independently and then combined thereafter. For example, one die may be made using a bipolar process and another may be made using a complementary metal oxide semiconductor (CMOS) process. Similarly, one die may use a logic process and the other die may use a memory process. For example, some dice may use stacked gate designs which may be incompatible with logic processes.

Thus, in a variety of situations, it may be desirable to put components in close proximity without making them on the same integrated circuit fabrication process. In addition, in some cases, the level of integration available may be such that to achieve the full capabilities, separate dice must be used. If separate dice are used, it may still be desirable to connect the dice together to the outside world through a single set of input and output connections. These input and output connections may be, for example, pins or solder balls. In some cases it may be desirable to interconnect the two dice to each other and then to interconnect them together to the outside world.

Thus, there is a need for packages which enable dice to be connected together before connection to the outside world.

SUMMARY

In accordance with one aspect, a multi-chip module includes a laminate layer having a top and a bottom sides and a passage. A first chip is secured to the bottom side of the layer. The first chip is wire bonded to the top side of the layer through the passage. A second chip is secured to the top side of the layer by bumps. The layer includes an extension accessible beyond one of the chips. The extension includes contacts on said bottom side, electrically coupled to said first and second chips.

Other aspects are described in the accompanying specification and claims.

DETAILED DESCRIPTION

Figure 1:
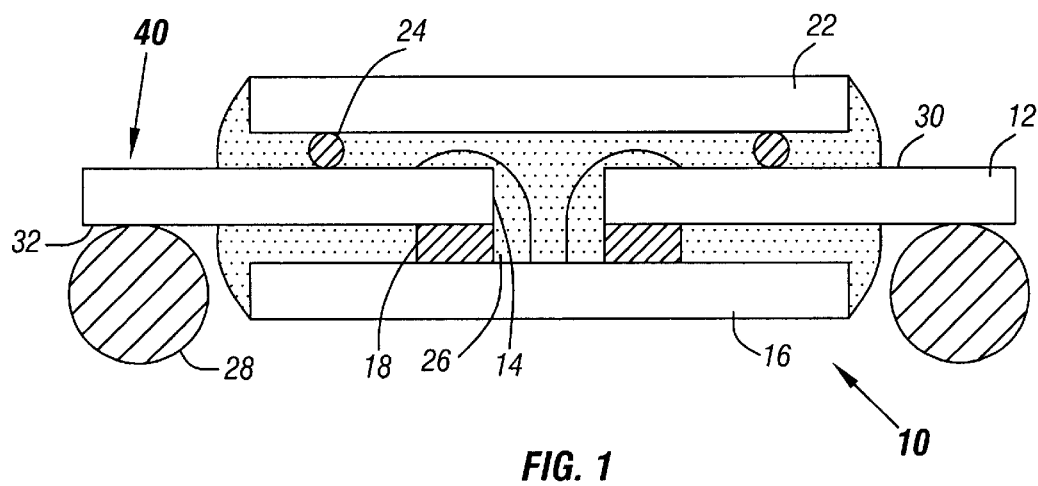
FIG. 1 is a greatly enlarged cross-sectional view of one embodiment of the present invention.

Referring to FIG. 1, a multi-chip module 10 includes a first chip 16, a second chip 22 and a laminate layer 12 sandwiched between the first and second chips 16 and 22. The laminate layer 12 provides one or more layers of conductive traces separated by insulators and coupled by vias to enable interconnection between the first chip 16, the second chip 22 and external devices (not shown).

The laminate layer 12 includes an upper side 30, a lower side 32 and central passage 14. The central passage may extend along the length of the module 10 in a rectangular arrangement, in one embodiment of the invention.

As shown in FIG. 1, the laminate layer 12 may extend outwardly beyond both of the first and second chips 16 and 22 to form an extension 40. The extension 40 provides a contact surface to make contact with external devices.

Figure 2:
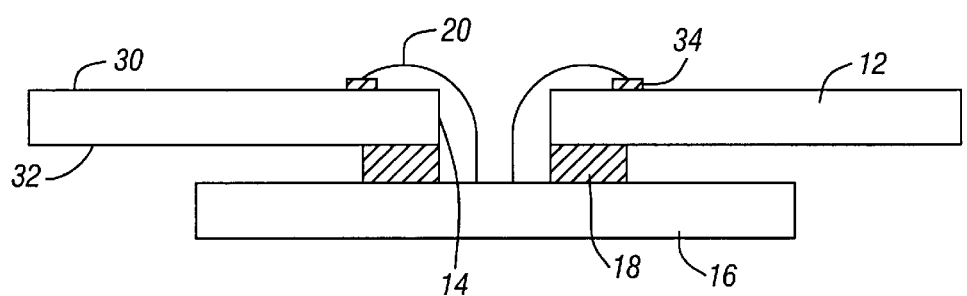
FIG. 2 is a greatly enlarged cross-sectional view of a subassembly, in accordance with the embodiment shown in FIG. 1, after a first chip has been connected to a laminate layer and the assembly wire bonded.

The first chip 16 may be coupled to the laminate layer 12 by extending wire bond wires 20 through the central passage 14 to the pads 34 on the upper surface 30 of the laminate layer 12, as shown in FIG. 2. The first chip 16 may be physically coupled to the second chip 22 by an adhesive layer 18. The adhesive layer 18 may conventionally be an adhesive tape strip which adhesively secures the upper surface of the first chip 16 to the lower surface 32 of the laminate layer 12.

The second chip 22 may be coupled to the laminate layer 12 directly using bumps 24 which may be formed of solder balls. As illustrated, the bumps 24 may be of substantially smaller diameter than the bumps 28 provided for connecting the entire module 10 to external devices.

In this way, a relatively low profile multi-chip module may be fabricated. For example, by way of illustration only, in one embodiment of the present invention, the first and second chips 16 and 22 may be on the order of 0.25 millimeters thick, the laminate layer 12 may be on the order of 0.25 millimeters thick and the spacing between the first and second chips may be on the order of 0.1 millimeters in the case of the second chip 22 and 0.075 millimeters in the case of the first chip 16. This gives an overall height of less than one millimeter. If the solder bumps 28 are on the order of 0.5 millimeters in diameter, the overall height of the assembly may be on the order of about one millimeter, for example 0.85 millimeter. Thus, a relatively compact, low profile assembly may be fashioned using the winged extension 40.

Referring now to FIG. 2, the sequence of assembling the multi-chip module 10 is illustrated. Initially the first chip 16 is secured by adhesive tape 18 to the lower surface 32 of the laminate layer 12. Wire bond wires 20 extend through the passage 14 to couple the pads 34 on the upper surface 30 of the laminate layer 12 to the first chip 16.

Figure 3:
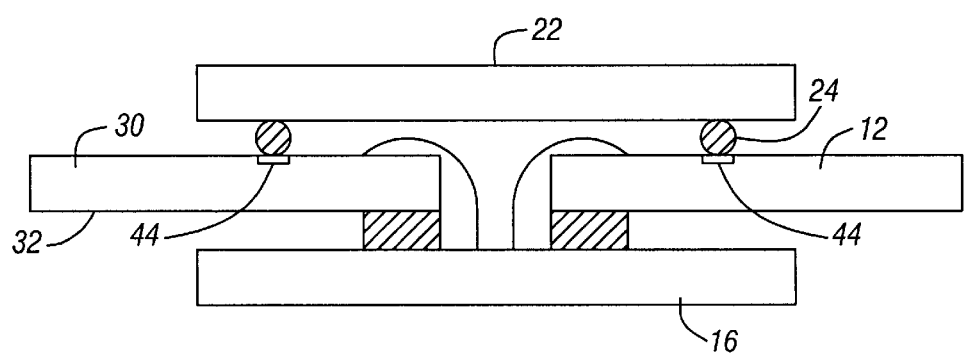
FIG. 3 is a greatly enlarged cross-sectional view of the embodiment shown in FIG. 2 after a second chip has been attached.

Turning next to FIG. 3, the second chip 22 may be surface mounted on the laminate layer 12 using solder balls 24. After a reflow step, the solder balls 24 soften sufficiently to secure the second chip 22 to be contacts 44 on the upper surface of the laminate layer 12.

Figure 4:
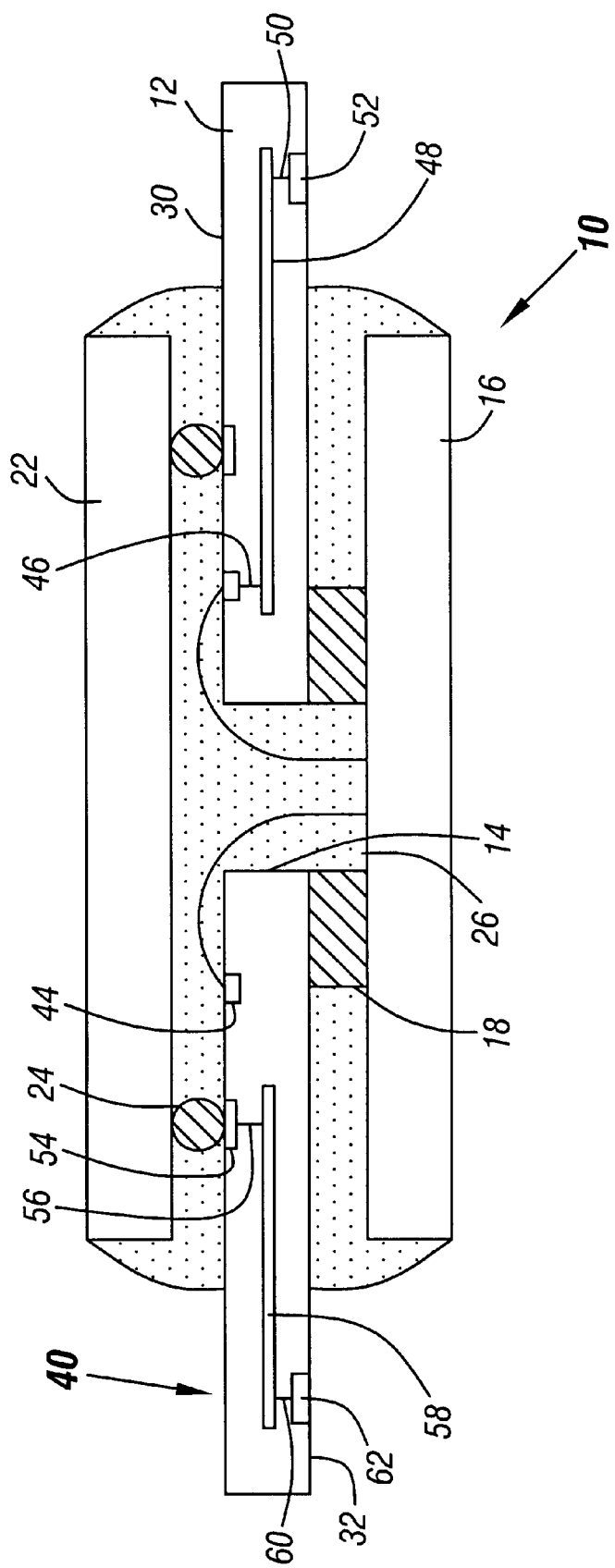
FIG. 4 is a greatly enlarged cross-sectional view of the package of FIG. 3 after it has been subject to encapsulation.

Thereafter, the entire assembly is placed in an encapsulation mold, in one embodiment of the present invention, forming the encapsulant 26 in the regions between the first and second chips 16 and 22, as shown in FIG. 4. This leaves the extension 40 extending outwardly from the rest of the package. Alternatively, the gaps between the chips 16 and 22 may be filled up with underfill material.

For example, in one embodiment of the present invention, solder balls or bumps 28 may be electrically coupled by contacts 52 or 62 to a trace 48 or 58 by way of a via 50 or 60. The traces 48 and 58 in turn may be coupled to each of the contacts 54 or 44 on the upper surface 30 of the laminate layer 12 by way of a via, 56 or 46.

Finally, the solder balls 28 or other interconnection devices are secured to the extensions 40. In this way, external devices may be contacted by the solder balls 28, making electrical connections to the first and second chips 16 and 22 through the laminate layer 12.

Figure 5:
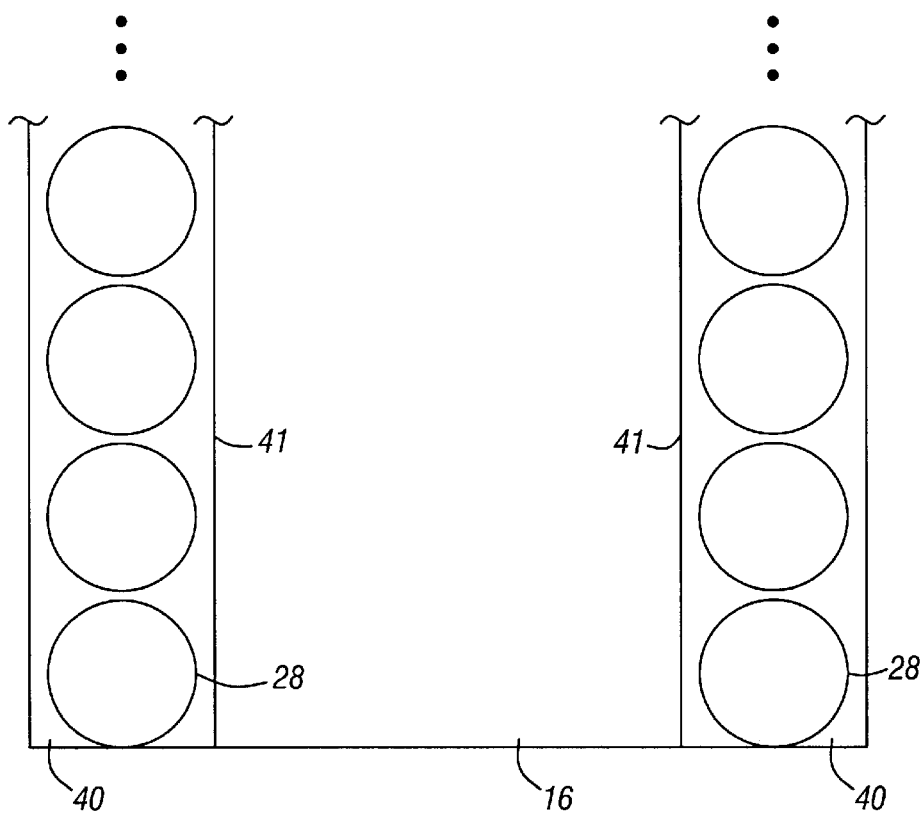
FIG. 5 is a greatly enlarged bottom plan view of one embodiment of the present invention.

Referring to FIG. 5, in one embodiment of the present invention, the extension 40 may extend outwardly from each opposed edges 41 of the module 10. Solder balls 28 may be aligned along each side in the length direction of the extension 40. In some embodiments, each extension 40 may extend outwardly beyond than the approximate width of one solder ball 28 so that a plurality of solder balls may be coupled, two or more solder balls deep, along the edges 41 of the module 10.

Figure 6:
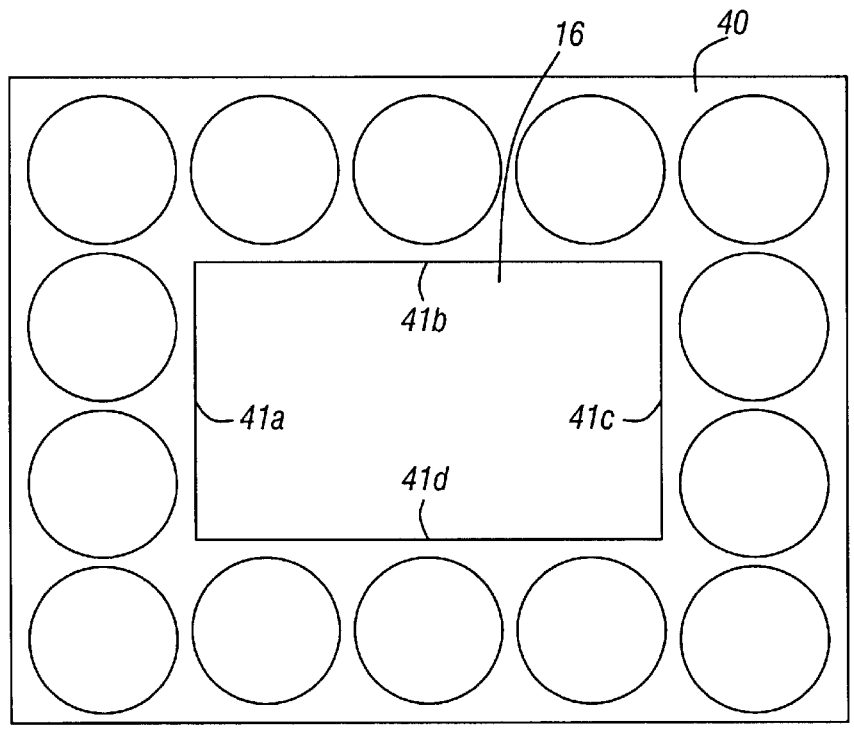
FIG. 6 is a greatly enlarged bottom plan view of another embodiment of the present invention.

Referring to FIG. 6, in accordance with still another embodiment of the present invention, the extension 40 may extend around all four edges 41 of the module 10. In this way, solder balls 28 may be coupled along four edge portions 41*a–d* to increase the number of connections that may be made. Again, the extension 40 may extend further outwardly to allow solder balls to be attached, two or more deep, along the edges 41 of the module 10.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of forming a multi-chip module comprising:
   adhesively securing a first chip to a first surface of a laminate layer;
   inverting the assembly of said laminate layer and said first chip;
   wire bonding said first chip to a second surface of said laminate layer;
   securing a second chip to the second surface of said laminate layer using bumps;
   positioning said first and second chips on said laminate layer so that at least a portion of said laminate layer extends outwardly beyond said first and second chips; and
   providing solder ball contacts on said first surface of said extension electrically coupled to said first and second chips.

2. The method of claim 1 including aligning said first and second chips over one another.

3. The method of claim 2 including providing a pair of extensions extending outwardly beyond said first and second chips.

4. The method of claim 2 including aligning said chips so as to form an extension of said laminate layer that extends outwardly beyond said chips and completely around said module.

5. The method of claim 3 including providing solder balls on said contacts on said extensions.

6. The method of claim 1 including filling a region between said chips with an encapsulant.

7. The method of claim 6 including forming a passage through said laminate layer and forming wire bonds from said first chip through said passage to the second surface of said laminate layer.

8. The method of claim 6 including coupling said contact and said first and second chips through traces extending through said laminate layer.

9. A method comprising:
   coupling a first chip to a first side of a support structure;
   bump bonding a second chip to a second side of said support structure;
   causing said support structure to extend outwardly beyond the first chip; and
   providing solder ball pads on the portion of said structure extending outwardly beyond said first chip, said pads electrically coupled to said first and second chips.

10. The method of claim 9 wherein coupling a first chip includes adhesively coupling a first chip to said support structure.

11. The method of claim 10 wherein coupling a first chip includes wire bonding said first chip to bonding pads on said second side of said support structure.

12. The method of claim 9 wherein causing said support structure to extend outwardly includes causing said support structure to extend outwardly from two opposed edges of the first chip.

13. The method of claim 12 wherein causing said support structure to extend outwardly includes causing said support structure to extend outwardly beyond four edges of said first chip.

14. The method of claim 9 wherein causing said support structure to extend outwardly includes causing said support structure to extend outwardly beyond said first and second chips.

15. The method of claim 9 including coupling said first and second chips to said solder ball pads on said portion via traces extending though said structure.

\* \* \* \* \*